(12) United States Patent
Tsai et al.

(10) Patent No.: US 7,947,518 B2
(45) Date of Patent: May 24, 2011

(54) METHOD FOR FORMING ELECTRONIC DEVICES BY USING PROTECTING LAYERS

(75) Inventors: Feng-Yu Tsai, Taipei (TW); Syue-Jhao Jhuo, Taipei (TW)

(73) Assignee: National Taiwan University, Taipei (TW)

( * ) Notice: Subject to any disclaimer, the term of this patent is extended or adjusted under 35 U.S.C. 154(b) by 777 days.

(21) Appl. No.: 11/830,365

(22) Filed: Jul. 30, 2007

(65) Prior Publication Data
US 2008/0124824 A1 May 29, 2008

(30) Foreign Application Priority Data
Nov. 28, 2006 (TW) .............................. 95143881 A

(51) Int. Cl.
*H01L 21/027* (2006.01)
*H01L 51/50* (2006.01)

(52) U.S. Cl. ................ 438/34; 438/22; 438/23; 438/29; 438/30; 438/35; 438/38; 257/40; 257/642; 257/E51.018; 257/E51.022; 257/E21.024

(58) Field of Classification Search ............. 438/22–47, 438/82, 99, 780, 788–789, 790, 792–794, 438/FOR. 135; 257/40, 642–643, 759, E39.007, 257/E33.001, E51.001–E51.052, E21.024–E21.026; 313/483, 498, 503–507
See application file for complete search history.

(56) References Cited

U.S. PATENT DOCUMENTS

| | | | | |
|---|---|---|---|---|
| 5,953,585 A * | 9/1999 | Miyaguchi | ....................... | 438/35 |
| 6,146,715 A * | 11/2000 | Kim et al. | ..................... | 427/555 |
| 6,541,130 B2 * | 4/2003 | Fukuda | ......................... | 428/690 |
| 6,552,488 B1 * | 4/2003 | Roitman et al. | .............. | 313/512 |
| 6,617,186 B2 * | 9/2003 | Kashiwabara | .................. | 438/29 |
| 6,811,808 B2 * | 11/2004 | Ohshita et al. | .................. | 427/66 |
| 6,835,953 B2 * | 12/2004 | Cok et al. | ......................... | 257/59 |
| 7,147,992 B2 * | 12/2006 | Itou et al. | ........................ | 430/321 |
| 7,259,514 B2 * | 8/2007 | Murayama et al. | ........... | 313/506 |
| 7,268,006 B2 * | 9/2007 | Macpherson et al. | .......... | 438/22 |
| 7,396,269 B2 * | 7/2008 | Tachikawa et al. | ............. | 445/24 |
| 7,396,637 B2 * | 7/2008 | Itou et al. | ........................ | 430/321 |
| 7,399,993 B2 * | 7/2008 | Matsuda | ......................... | 257/89 |
| 7,534,557 B2 * | 5/2009 | Tachikawa et al. | ........... | 430/321 |
| 7,554,112 B1 * | 6/2009 | Lang et al. | ....................... | 257/40 |
| 7,615,790 B2 * | 11/2009 | Lee | ................................. | 257/79 |
| 7,709,833 B2 * | 5/2010 | Matsuda | ......................... | 257/40 |
| 7,736,921 B2 * | 6/2010 | Tachikawa et al. | ............. | 438/29 |
| 7,816,857 B2 * | 10/2010 | Ryu et al. | ....................... | 313/504 |
| 2005/0032453 A1 * | 2/2005 | Tachikawa et al. | ........... | 445/24 |
| 2005/0100658 A1 * | 5/2005 | MacPherson et al. | .......... | 427/58 |
| 2006/0105201 A1 * | 5/2006 | Lee et al. | ....................... | 428/690 |
| 2007/0029539 A1 * | 2/2007 | Yashima et al. | ................ | 257/13 |
| 2007/0057264 A1 * | 3/2007 | Matsuda | ......................... | 257/88 |
| 2007/0176173 A1 * | 8/2007 | Ramakrishnan et al. | ....... | 257/40 |

(Continued)

*Primary Examiner* — Matthew C Landau
*Assistant Examiner* — Maliheh Malek
(74) *Attorney, Agent, or Firm* — Hoffmann & Baron, LLP

(57) ABSTRACT

This invention discloses that photolithography can be made compatible with the production of electronic devices containing sensitive materials, if the sensitive materials are overcoated with an ultra-thin layer of non-reactive materials (e.g. inorganic oxides) before undergoing photolithographic patterning. This protecting layer isolates the sensitive materials from solvents and etching reactants used in photolithographic patterning, and does not need to be removed from the sensitive materials after patterning is completed. This invention enables photolithography to be applied to the production of electronic devices containing sensitive materials, facilitating the development of commercially viable production processes for these devices.

7 Claims, 13 Drawing Sheets

U.S. PATENT DOCUMENTS

| | | |
|---|---|---|
| 2007/0200123 A1* | 8/2007 | Yamamichi et al. ............ 257/89 |
| 2008/0007168 A1* | 1/2008 | Lee et al. ...................... 313/506 |
| 2008/0282921 A1* | 11/2008 | Macpherson et al. ........ 101/485 |
| 2009/0231243 A1* | 9/2009 | Song ............................... 345/76 |
| 2009/0278450 A1* | 11/2009 | Sonoyama et al. ........... 313/504 |
| 2009/0302333 A1* | 12/2009 | Seki et al. ...................... 257/88 |
| 2010/0084672 A1* | 4/2010 | Ueno et al. ..................... 257/98 |
| 2010/0108991 A1* | 5/2010 | Tanaka et al. .................. 257/40 |
| 2010/0136723 A1* | 6/2010 | Yoo et al. ....................... 438/23 |
| 2010/0258833 A1* | 10/2010 | Okumoto et al. ............... 257/98 |
| 2010/0270545 A1* | 10/2010 | Kosowsky ...................... 257/40 |
| 2010/0295052 A1* | 11/2010 | Yamazaki et al. .............. 257/60 |
| 2010/0295085 A1* | 11/2010 | Tanaka ........................... 257/98 |
| 2010/0314644 A1* | 12/2010 | Nishimura et al. ............. 257/98 |

* cited by examiner

METHOD FOR FORMING ELECTRONIC DEVICES BY USING PROTECTING LAYERS

FIELD OF THE INVENTION

The present invention relates to a method for forming electronic devices, and more particularly to a method for forming electronic devices by using protecting layers.

BACKGROUND OF THE INVENTION

Since electronic devices made of sensitive materials have many advantages and features, these electronic devices are widely used in the field of organic light emitting diode (OLED) displays and adopted for mass production by the related industry in recent years.

The preparation of electronic devices made of sensitive materials of this type requires patterning processes with high precision and throughput to place sensitive materials in specific areas such as the pixels of an organic light emitting diode (OLED) display, but it is difficult to apply the existing industrial patterning techniques together with the sensitive materials.

For instance, the photolithographic patterning technique is one of the most matured and popular techniques used in the industry, but this technique cannot be applied to sensitive materials, since the solvent, etching solution (or gas) used in a photolithographic process must be in a direct contact with the sensitive materials, causing them to be chemically reacted to lose their original properties.

Patterning techniques other than the photolithographic technology, such as an ink-jet printing or deposition with shadow masks, still have problems of applicability, including poor resolution, damage to the sensitive materials, and time-consuming process. As a result of this lack of practical patterning technique, mass production of optoelectronic products containing sensitive materials has been stymied.

Photolithography is a widely used patterning technique throughout the industry because of its major advantages as described below.
(1) The processes and equipments for mass production are well-developed.
(2) The resolution of patterns is high.

Prior arts regarding improving the compatibility of photolithography with sensitive materials include the taco references described as follows:

The first cited reference is U.S. Pat. No. 6,617,186 entitled "Method for producing electroluminescent element" and issued on Sep. 9, 2003 teaches a method of using organic optoelectronic materials directly in a photolithographic patterning process for the preparation of an organic light emitting diode (OLED) display without any measures of protecting the organic optoelectronic materials.

Therefore, the application of this method has a certain level of difficulty, because the solvent and etching solution (or gas) used in the photolithographic process are in a direct contact with the organic optoelectronic materials, and most known organic optoelectronic materials can be chemically reacted to lose their original properties. To the best of our understanding, no manufacturer of the related industry has actually adopted this method for productions so far.

The second cited reference is U.S. Pat. Publication No. 20050032453 entitled "Method for fabricating organic EL element" and published on Feb. 10, 2005.

This invention teaches a method of applying a polymer protecting layer on the organic optoelectronic materials to be patterned, followed by a photolithographic patterning process. After the patterning process is completed, the polymer protecting layer is removed, and then subsequent processing steps are carried out to complete an organic light emitting diode (OLED) display.

Although this method uses a polymer layer to protect organic optoelectronic materials, the polymer layer must be removed by an etching solution or gas after the photolithographic process is completed, and the etching process can seriously damage the organic optoelectronic materials. Therefore, this method is difficult to implement in practical applications. To the best of our understanding, no manufacturer of the related industry has adopted this method for productions so far.

SUMMARY OF THE INVENTION

The present invention involves forming an ultra thin protecting layer of a non-reactive material such as an inorganic oxide layer on the sensitive material to be patterned; during a subsequent photolithographic patterning process, the oxide layer isolates the solvents and etching reactants used in the patterning process from the sensitive materials to be patterned, preventing them from being damaged by the patterning process. This invention enables photolithography to be directly applicable to the patterning of sensitive materials in the manufacturing of optoelectronic products.

The thickness of the protecting layer of the present invention is very thin, and the size falls within a range from approximately several to hundreds of angstroms (Å), and thus it is not necessary to remove the protecting layer from the surface of the patterned materials after the patterning process is completed, such that the protecting layer remains as an integral part of the product.

The protecting layer of the invention is adequately thin that it not only has no adverse effect on the product, but also enhances the product performance, if it is of proper material and thickness. For example, the present invention uses aluminum oxide as the protecting layer for patterning organic electroluminescent materials in the fabrication of an organic light emitting diode (OLED) display, and at a thickness of 12 Å, the protecting layer improves the brightness and efficiency of the OLED display compared with a similar OLED display without the protecting layer and without being patterned.

In the first preferred embodiment of the present invention, a full-color organic light emitting diode (OLED) display is produced by utilizing the said patterning process. In the first stage of preparing red pixels, the procedure comprises of providing a substrate with a transparent conductive layer thereon, and then coating a red organic electroluminescent material onto the transparent conductive layer to form a first light-emitting layer. An aluminum oxide thin film is deposited onto the first light-emitting layer to form a first protecting layer. A photoresist is coated onto the first protecting layer to form a first photoresist layer. Appropriate photomask and exposure process are used to define a desired latent image on the first photoresist layer. After the first photoresist layer is exposed, the remaining pattern of the photoresist layer is developed by a developing solution. As the first photoresist layer is developed, the exposed first protecting layer in the area without the protection of the first photoresist layer is removed by the developing solution as well. A dry etching method or a wet etching method is adopted for etching the first light-emitting layer. A solution or plasma method is adopted for removing the first photoresist layer, during which the first light-emitting layer remains protected by the first protecting layer.

Upon completion of the red pixels, green pixels made of a green organic electroluminescent material are prepared. An aluminum oxide thin film is deposited onto the second light-emitting layer of the green electroluminescent material to form a second protecting layer. The subsequent patterning process of exposure, etching (developing) and photoresist removal steps is the same as that used for patterning the red pixels. During the patterning of the green pixels, the previously formed red pixels are protected by the first protecting layer, and thus are not directly in contact with and damaged by the solvent and etching reactant in the photolithographic process used in the second stage.

Upon completion of the red and green pixels, blue pixels made of a blue organic electroluminescent material are prepared following the same patterning process. The third light-emitting layer of the blue electroluminescent material is protected with a third protecting layer of aluminum oxide during patterning. Similarly, the red and green pixels are protected by the first and second protecting layers, respectively, during the patterning of the blue pixels. Finally, an evaporation deposition is performed to deposit a common cathode, completing a full-color organic light emitting diode (OLED) display.

The second preferred embodiment of the present invention produces a patterned monochrome organic light emitting diode (OLED) display through photolithographic patterning. In this preferred embodiment, a glass substrate with a transparent conductive layer attached thereon is provided, and the transparent conductive layer is coated with a light-emitting layer. An aluminum oxide thin film is coated onto the light-emitting layer to form a protecting layer; a photoresist is coated on the protecting layer to form a photoresist layer; a photomask is used for performing an exposure; and then the exposed portion of the photoresist layer is washed away by a developing solution, and the unexposed portion of the photoresist layer remains. After the photoresist is washed away, the protecting layer at the exposed region is dissolved and washed away by the developing solution. The exposed light-emitting layer at the exposed region is washed away, and the light-emitting layer at the unexposed region remains. The unexposed photoresist layer is then removed by a solution or a plasma method. Finally, an evaporation deposition is performed to form a cathode onto the protecting layer, so as to complete a monochrome organic light emitting diode (OLED) display.

The scope of applicability of the present invention is broad, since the invention can be used in any product requiring a pattern made of sensitive materials such as a pattern made of organic luminescent materials for an organic light emitting diode (OLED) display, a pattern made of organic semiconductor materials for an organic thin-film transistor, a pattern made of organic optoelectronic materials for an organic solar cell, a pattern made of organic materials for various display devices and electronic products, and a pattern made of sensitive inorganic materials for various display devices and electronic products in the manufacturing process.

In the present invention, a thin film protecting layer is added to a product of sensitive materials, so that the sensitive materials of the product can be patterned by a photolithographic patterning process during its manufacturing process, and the thin film protecting layer remains an integral part of the product. The thin film protecting layer not only protects the sensitive materials and prevents them from being damaged by the manufacturing process, but also enhances the performance of the product. In addition, the thin film protecting layer can be any material that is not affected by the environment of the manufacturing process and such material can be inorganic oxide, metal, ceramic or polymer, etc.

The present invention enables photolithography to be directly applied to patterning products containing sensitive materials, addressing the difficulty of patterning sensitive materials with high-precision and high throughput. The present invention offers a practical and economic solution to the patterning of sensitive materials.

To facilitate the disclosure of the innovative features and technical content of the present invention, we use preferred embodiments together with the attached drawings for detailed description of the invention, but it should be noted that the attached drawings are provided for reference and description but not to limit the scope of the present invention.

DETAILED DESCRIPTION OF THE PREFERRED EMBODIMENTS

The above and other objects, features and advantages of the present invention will become apparent from the following detailed description taken with the accompanying drawing.

The method in accordance with the present invention is applicable for any optoelectronic or electronic device made of sensitive materials such as various display devices and electronic products including organic light emitting diode (OLED) displays, organic thin-film transistors, organic solar cells, organic memories, organic materials, and various display devices, etc.

The present invention utilizes an incorporated protecting layer to form electronic devices, and a first preferred embodiment of the invention uses an OLED electroluminescent material for illustration. The method of the first preferred embodiment describes a full-color organic light emitting diode (OLED) display, which is a display device composed of pixels of three colors, red, green and blue (RGB), each of which contains a layer of organic electroluminescent (EL) materials patterned using photolithography.

Figure 1A:
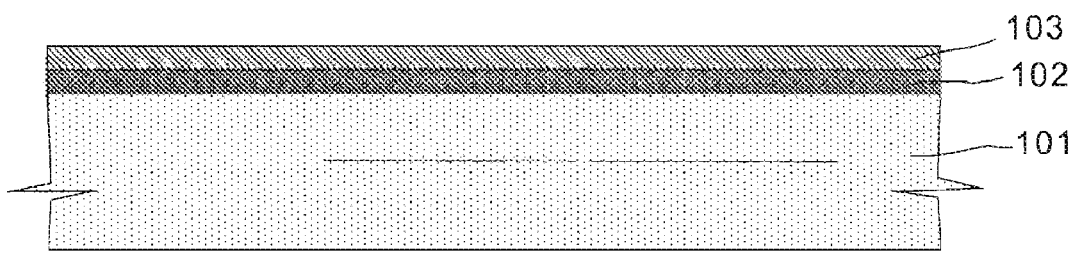
FIGS. 1A to 1R show a first preferred embodiment of the present invention.
Figure 1B:
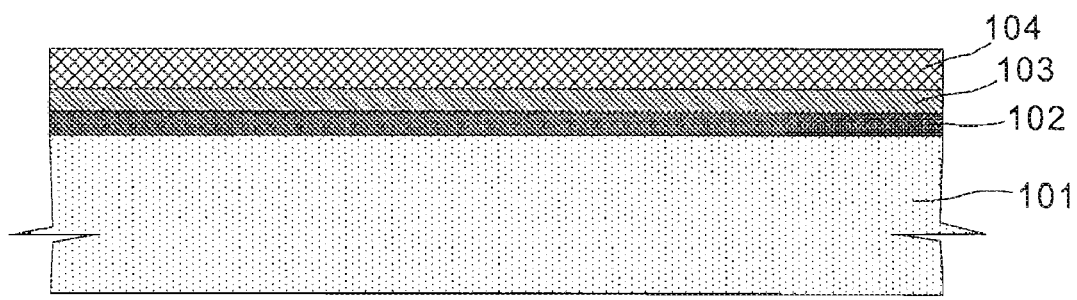
Figure 1C:
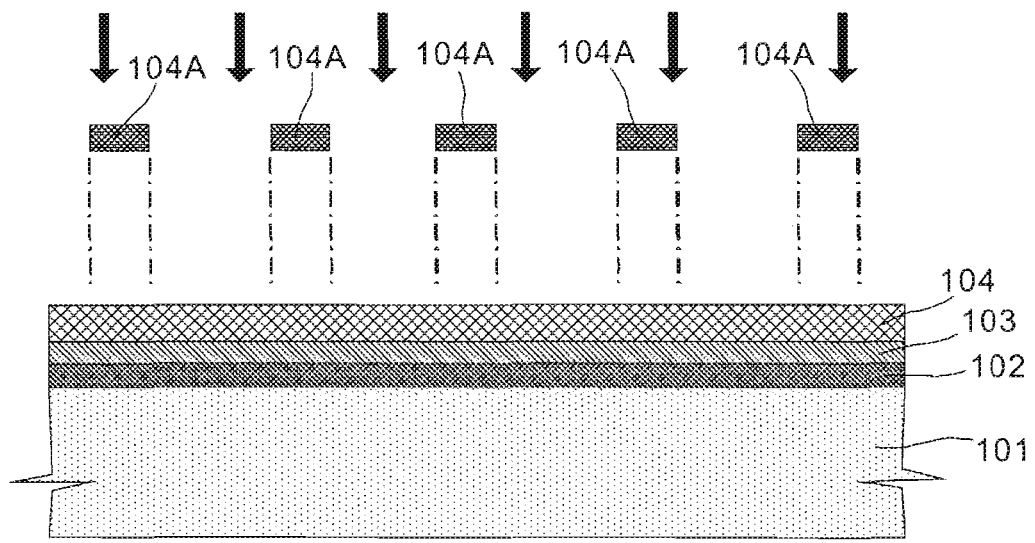
Figure 1D:
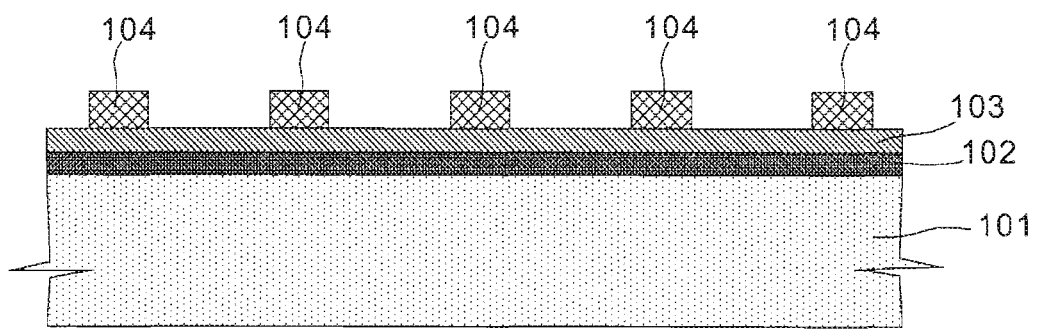
Figure 1E:
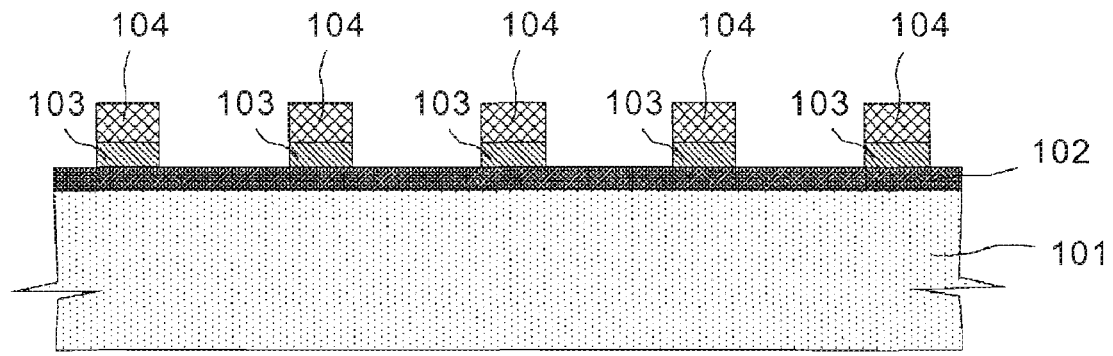
Figure 1F:
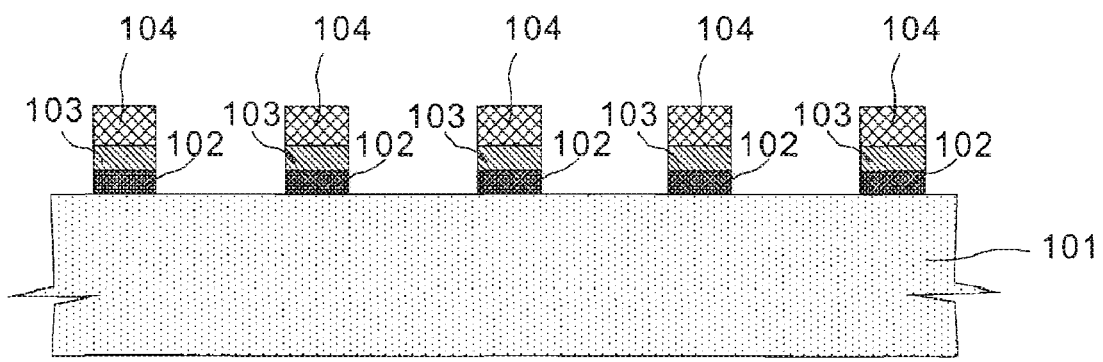
Figure 1G:
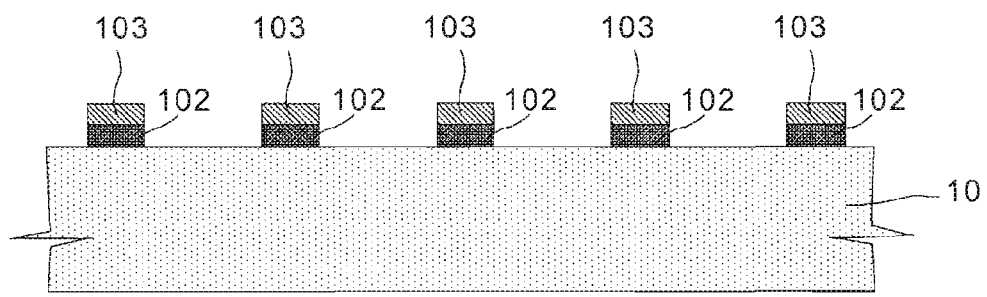
Figure 1H:
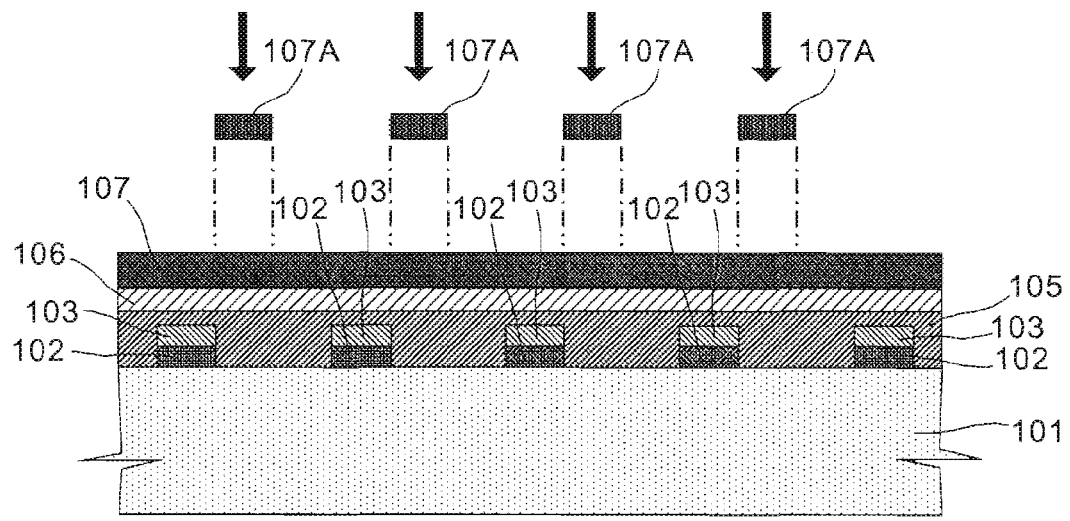
Figure 1I:
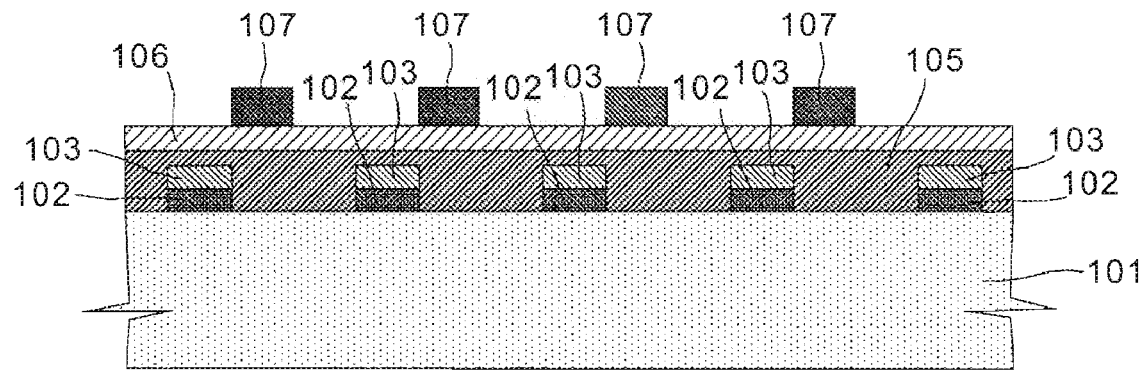
Figure 1J:
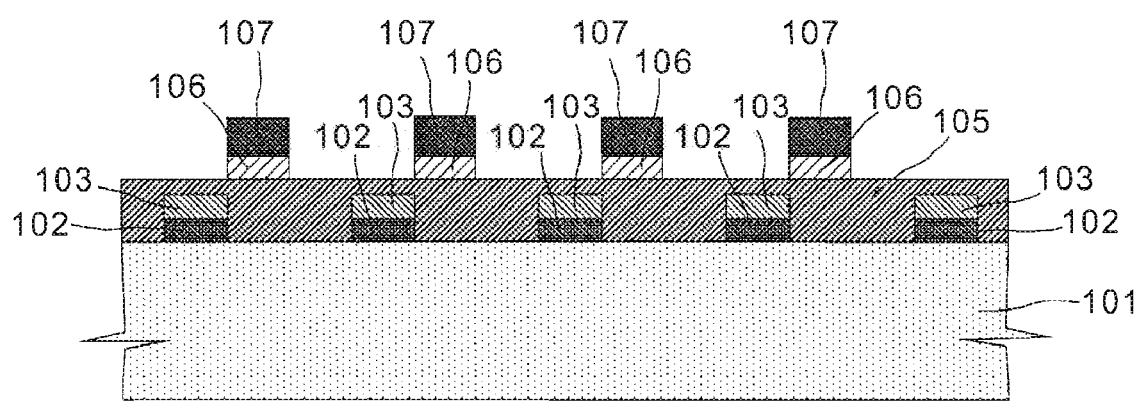
Figure 1K:
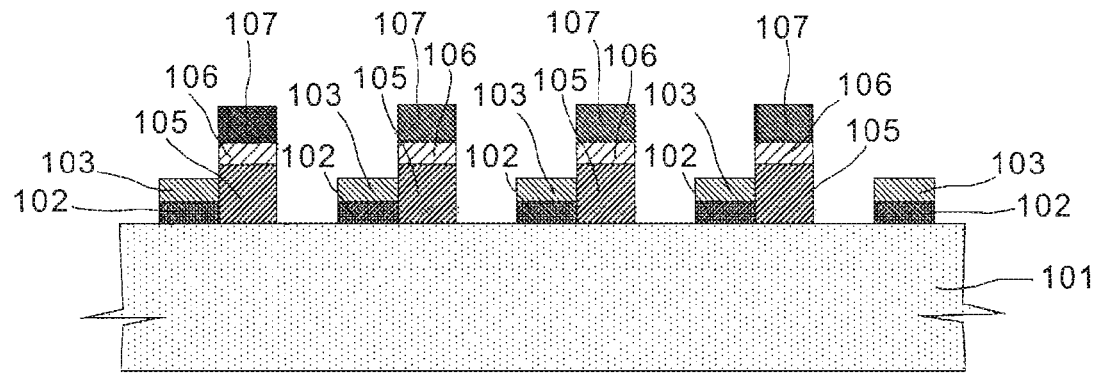
Figure 1L:
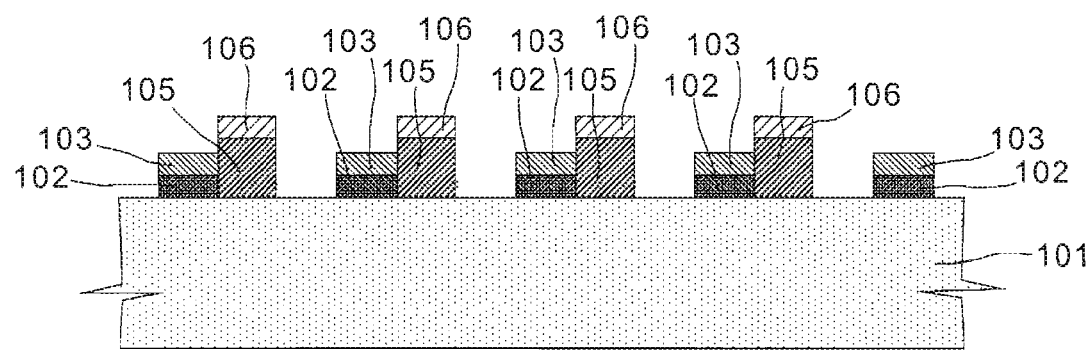
Figure 1M:
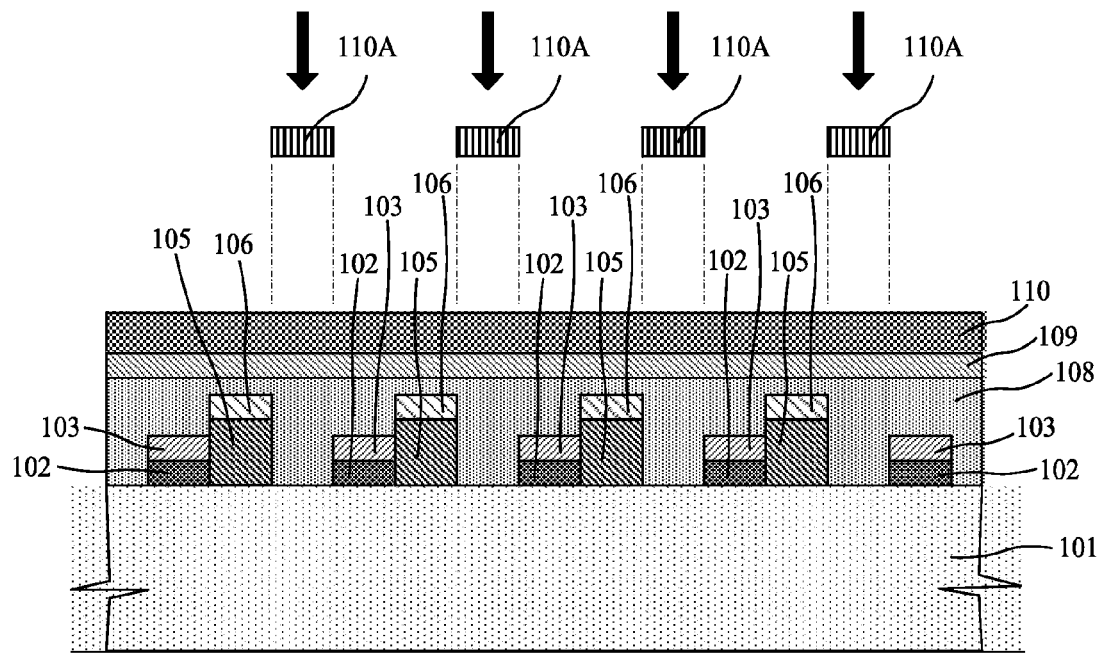
Figure 1N:
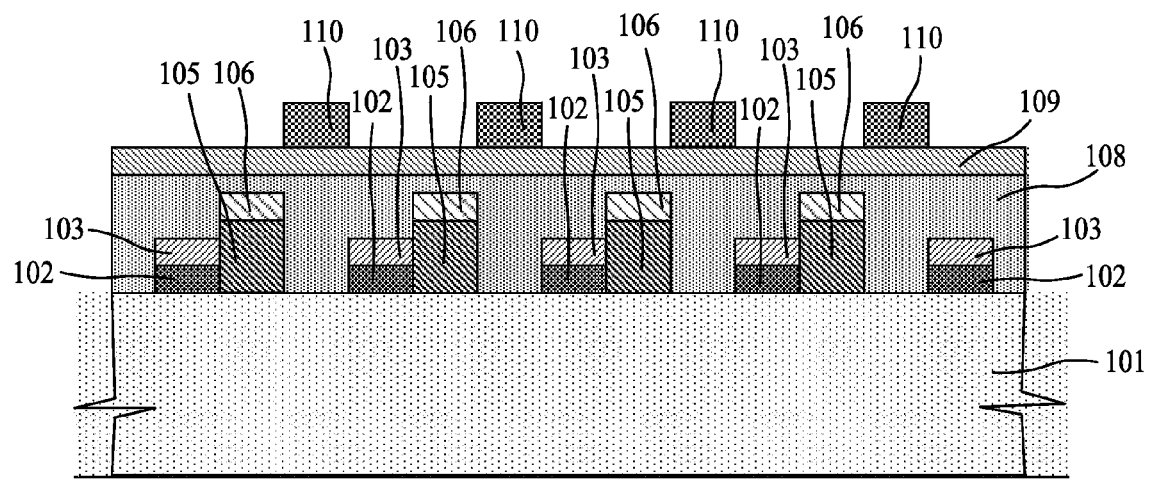
Figure 10:
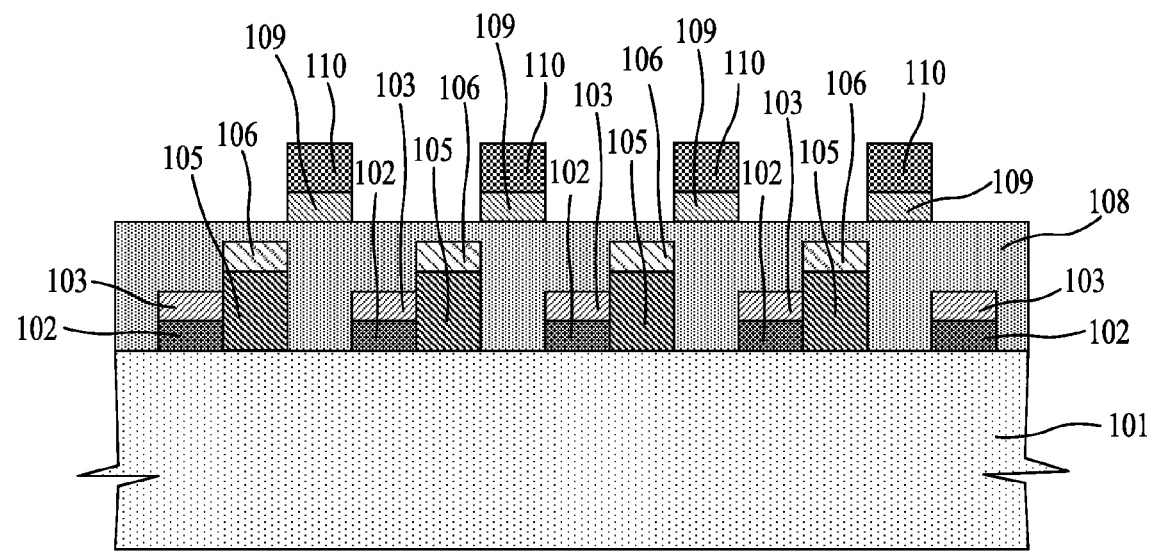
Figure 1P:
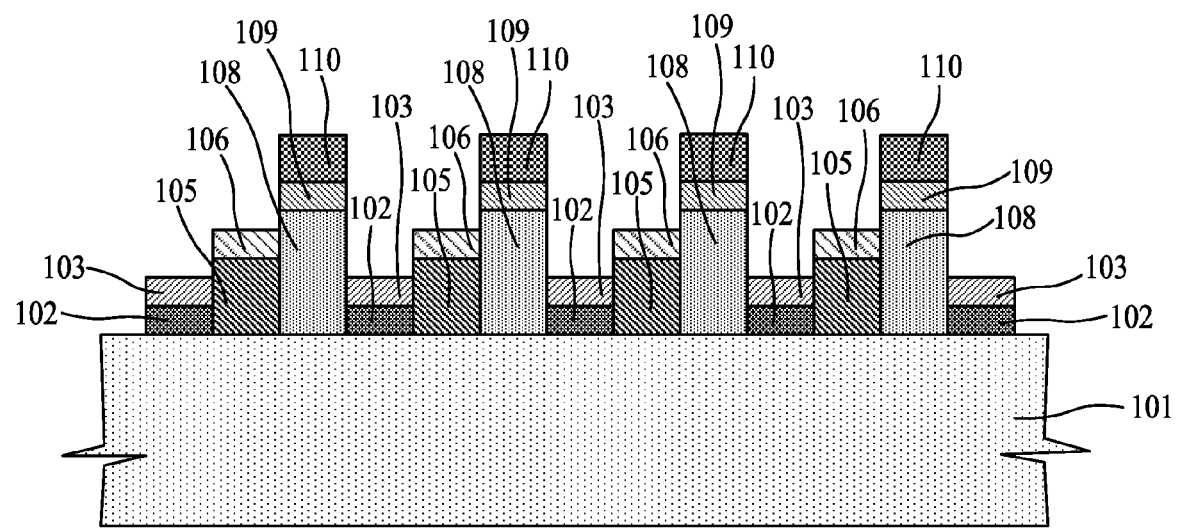
Figure 1Q:
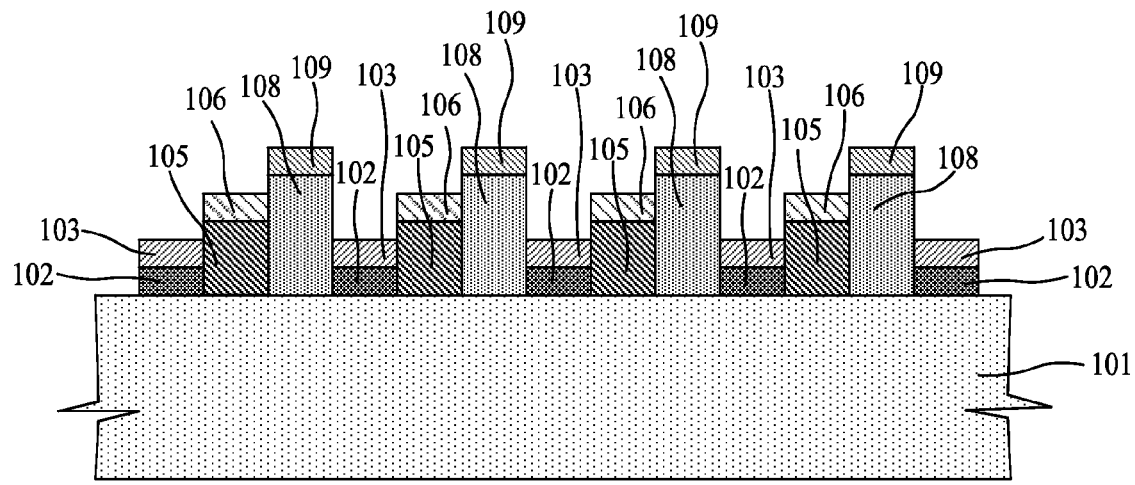
Figure 1R:
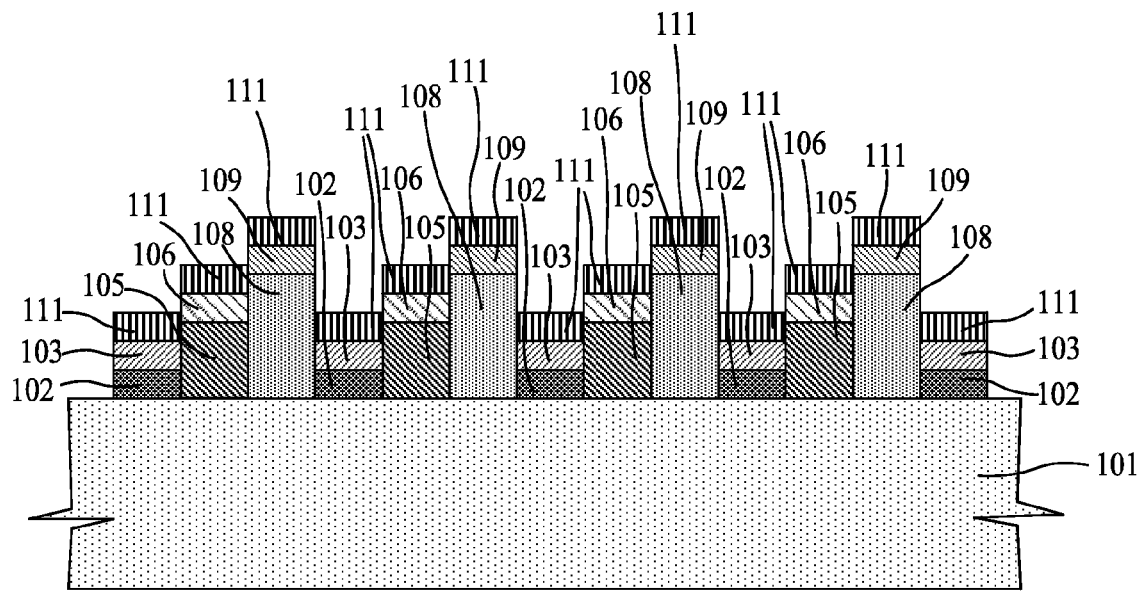

Refer to FIGS. 1A to 1R for schematic views of a patterning process of a first color organic electroluminescent material in accordance with the present invention. A detailed description of the preferred embodiment is given, and a red organic electroluminescent material is selected for illustration. The procedure of the patterning process is described as follows:

In FIG. 1A, a substrate 101 is provided, and the substrate 101 can be made of glass, silicon, polymer, metal or any other common substrate material, and then a red organic electroluminescent material is coated on the substrate 101 to form a first light-emitting layer 102, and finally an aluminum oxide thin film, which is the first protecting layer 103, is coated onto the first light-emitting layer 102.

In general, it is necessary to coat an electrically conductive material on the substrate 101 as an electrode for forming a passive component or a thin film transistor that serves as a driver for forming an active component. The organic electroluminescent material can be made of small organic molecules or polymers. The protecting layers, including the first protecting layer 103 and subsequent protecting layers, can be formed via various coating methods such as physical vapor deposition (PVD), chemical vapor depositions (CVD), spin coating and other common thin film coating methods. This embodiment uses atomic layer deposition (ALD), which is a type of chemical vapor deposition, to form the protecting layers. The thin film protecting layer 103, which is also the first protecting layer 103, can be of any material that is not affected by the organic solvent and etching reactant, and the material can be inorganic oxide, polymer, metal, ceramic or other material with similar properties. The method of this embodiment adopts aluminum oxide as the thin film protecting layer. The thin film protecting layer 103, which is the first protecting layer 103, has a sufficient thickness to protect the organic electroluminescent material from affecting the properties of the OLED device, and the thickness adopted in this preferred embodiment is approximately 12 Å to 30 Å, but the applicable thickness falls within a range from several tens to hundreds of angstroms.

In FIG. 1B, a photoresist is coated on a first protecting layer 103 to form a first photoresist layer 104.

In FIG. 1C, a first patterning process is performed by using appropriate first photomask 104A and exposure process to define a desired latent image on the first photoresist layer 104.

In FIG. 1D, after the first photoresist layer 104 is exposed, a developing solution is used to develop the desired pattern, and a portion of the first photoresist layer 104 is removed, and a portion of the first photoresist layer 104 is remained.

In FIG. 1E, as the first photoresist layer 104 is developed, an exposed first protecting layer 103 in an area without the protection of the first photoresist layer 104 is also removed by the developing solution. Since the developing solution is commonly a weak alkali and the first protecting layer 103 is a very thin layer of aluminum oxide, which is highly soluble in an alkaline or acidic solvent, it is not necessary to increase the developing time for the removal of the first protecting layer 103.

In FIG. 1F, the first light-emitting layer 102 is etched by using a dry etching method or a wet etching method.

In FIG. 1G, a solution or plasma method is employed to remove the remaining first photoresist layer 104, and the first light-emitting layer 102 remains protected by the first protecting layer 103.

In FIGS. 1H to 1L, a green material is selected as a second color organic electroluminescent material for the patterning process. In tile patterning process, the exposure, etching (developing) and the removal process are the same as those of the patterning process at the first stage. In the first stage, the patterns of the first light-emitting layer 102 and the first protecting layer 103 are formed by a red organic electroluminescent material. Due to the protection provided by the first protecting layer 103, the organic electroluminescent material is not in a direct contact with the solvent and etching reactant in the photolithographic process at the second stage and thus the organic electroluminescent material are not damaged.

In FIG. 1H, a green organic electroluminescent material is coated onto the substrate 101, the first light-emitting layer 102 and the first protecting layer 103 to form a second light-emitting layer 105. A second protecting layer 106 is formed onto the second light-emitting layer 105. A second patterning process is performed to coat a photoresist onto the second protecting layer 106 to form a second photoresist layer 107. Appropriate second photomask 107A and exposure process are used to define a required latent image on the second photoresist layer 107.

In FIG. 1I, after the second photoresist layer 107 is exposed, the developing solution is used for developing a required pattern, and a portion of the second photoresist layer 107 is removed, and a remaining second photoresist layer 107 is kept.

In FIG. 1J, as the second photoresist layer 107 is developed, an exposed second protecting layer 106 in an area without the protection of the second photoresist layer 107 is also removed by the developing solution.

In FIG. 1K the second light-emitting, layer 105 is etched by using a dry etching method or a wet etching method.

In FIG. 1L, a solution or plasma method is used to remove the remaining second photoresist layer 107, and the second light-emitting layer 105 remains protected by the second protecting layer 106.

In FIGS. 1M to 1Q, a blue material is selected as a third color organic electroluminescent material for the patterning process. Similarly, the use of the aluminum oxide thin film protecting layer can isolate the solvent and etching reactant from the organic electroluminescent materials during the photolithographic process at the third stage and prevent the red and green organic electroluminescent materials from being damaged.

In FIG. 1M, the blue organic electroluminescent material is coated onto the substrate 10, the first light-emitting layer 102, the first thin film protecting layer 103, the second light-emitting layer 105 and the second protecting layer 106 to form a third light-emitting layer 108. The third protecting layer 109 is formed onto the third light-emitting layer 108. A third patterning process is performed to coat a photoresist onto the third protecting layer 1(09 to form a third photoresist layer 110. An appropriate third photomask 110A and exposure process are used to define a required latent image on the photoresist.

In FIG. 1N, after the third photoresist layer 110 is exposed, the developing solution is used to develop a required pattern, and a portion of the third photoresist layer 110 is removed, and a remaining third photoresist layer 110 is kept.

In FIG. 1O, as the third photoresist layer 110 is developed, an exposed third protecting layer 109 at an area without the protection of the third photoresist layer 110 is also removed by the developing solution In FIG. 1P, the third light-emitting layer 108 is etched by using a dry, etching method or a wet etching method.

In FIG. 1Q, a solution or plasma method is used to remove the remaining third photoresist layer 110, and the third light-emitting layer 108 remains protected by the third protecting layer 109.

In FIG. 1R, after the patterns of three colors of the organic electroluminescent materials are completed, an evaporation deposition is preformed to deposit an electrically conductive material on the first protecting layer 103, the second protecting layer 106, and the third protecting layer 109 to form a cathode layer 111, so as to complete the production of the full color organic light emitting diode (OLED) display device, whose structure comprises a cathode, an anode, and patterned light-emitting layer and protecting layer. The protecting layers can isolate air and environmental changes to prevent adverse effects on the materials of the devices.

Figure 2A:
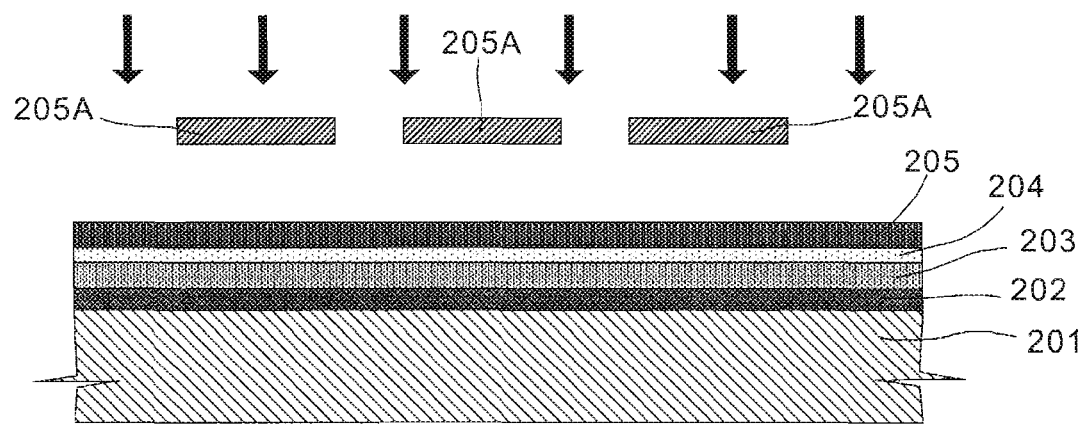
FIGS. 2A to 2F show a second preferred embodiment of the present invention.

The method adopted by the second preferred embodiment of the present invention is similar to the first preferred embodiment. The second preferred embodiment adopts a photolithographic patterning process and a polymer luminescent material (MEH-PPV) to produce monochrome OLED devices, and its manufacturing procedure is described in details as follows:

In FIG. 2A, a glass substrate 201 with an indium tin oxide (ITO) conductive layer 202 thereon is provided, and a polymer luminescent material (MEH-PPV) is coated on the indium tin oxide conductive layer 202 by a spin coating process to form a light-emitting layer 203. An aluminum oxide (Al2O3) thin film with a thickness of 12 Å to 15 Å (wherein the thickness may fall within a range from several tens to hundreds of angstroms) is deposited on the light-emitting layer 203 by an atomic layer deposition (ALD) method to form a protecting layer 204. The patterning process is performed by coating a photoresist on the protecting layer 204 by a spin coating process to form a photoresist layer 205 and a metal contact photomask 205A, and an exposure is performed by the metal contact photomask 205A.

Figure 2B:
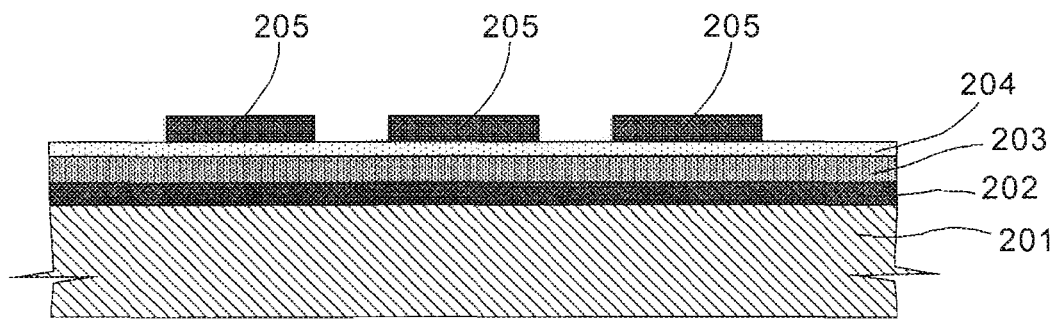

In FIG. 2B, an exposed portion of the photoresist layer 205 is washed away by the developing solution, and an unexposed portion of the photoresist layer 205 remains.

Figure 2C:
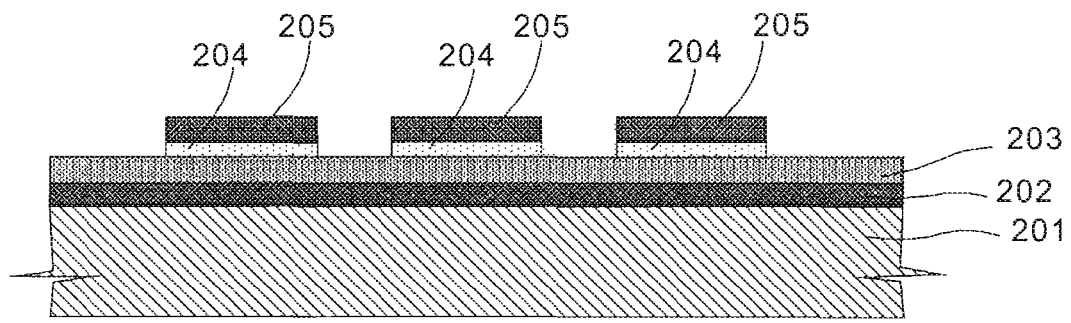

In FIG. 2C, the exposed portion of the photoresist layer 205 is washed away by the developing solution, and the exposed portion of the protecting layer 204 is dissolved and washed away by the developing solution.

Figure 2D:
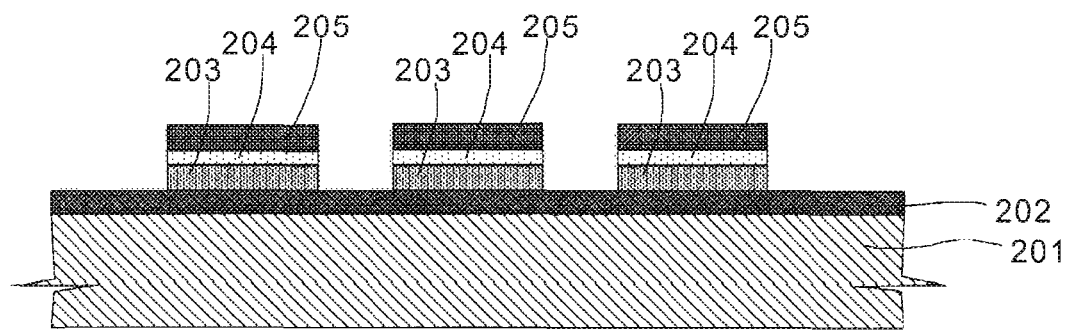

Referring to FIG. 2D, the exposed light-emitting layer 203 at the exposed position is washed away by toluene, and the light-emitting, layer 203 at the unexposed position remains.

Figure 2E:
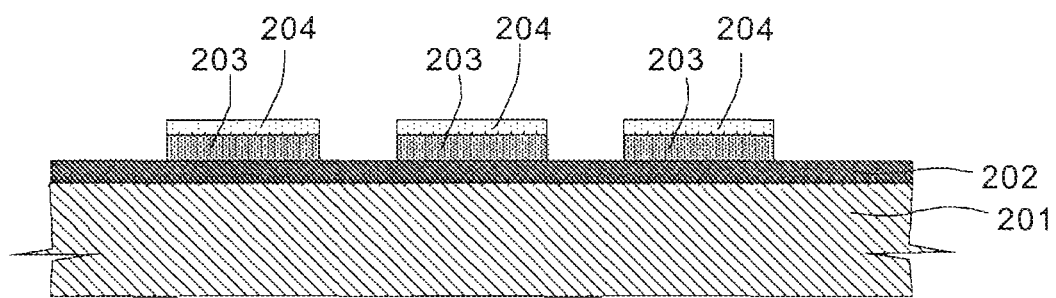

In FIG. 2E, the remaining photoresist layer 205 is washed away by acetone.

Figure 2F:
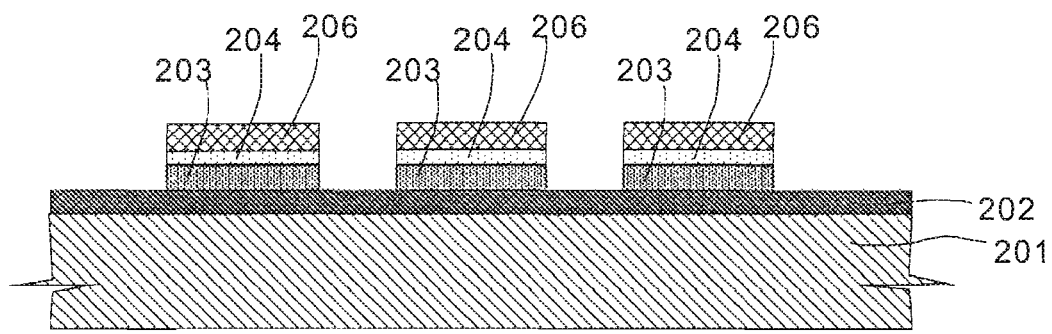

In FIG. 2F, an evaporation deposition is performed to deposit an aluminum electrode on the protecting layer 204 to form a deposition layer 206 with a thickness of 500 nm, so as to complete preparing a monochrome OLED device.

Figure 3:
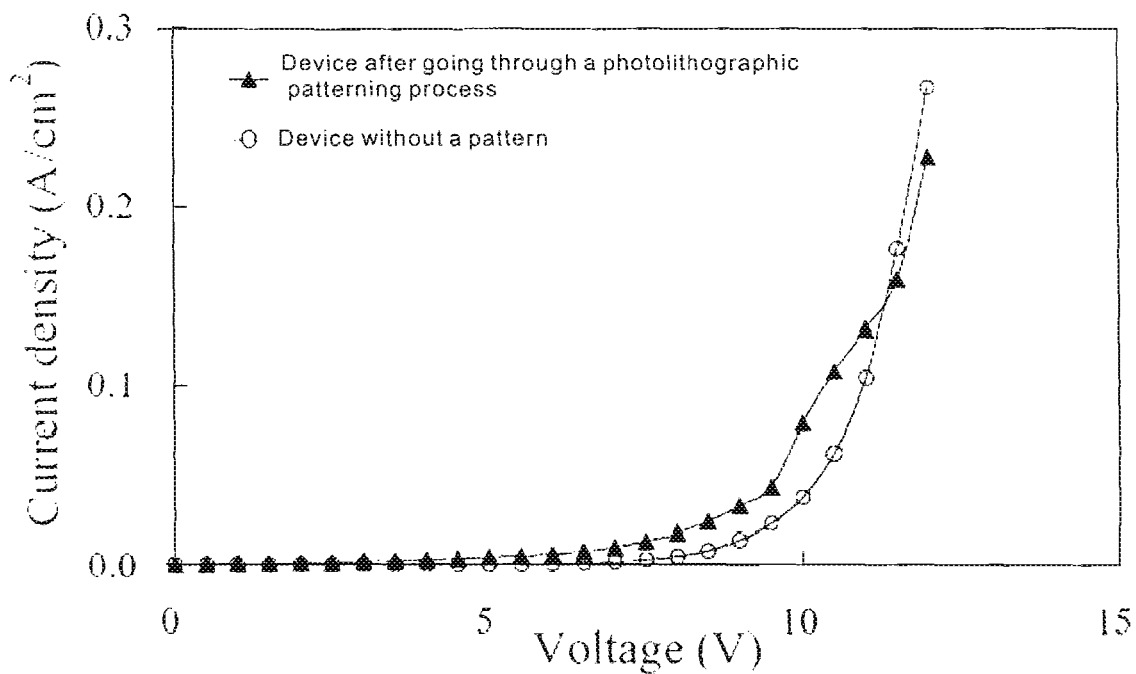
FIG. 3 shows the relation between voltage and current density of OLED devices with/without photolithographic patterning.
Figure 4:
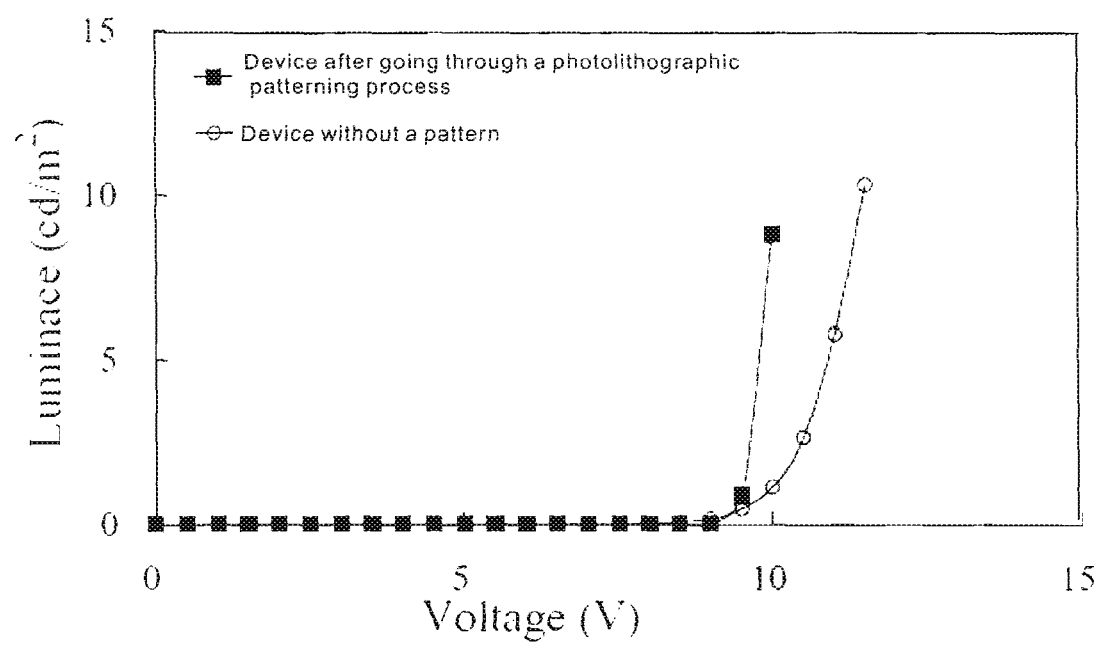
FIG. 4 shows the relation between voltage and brightness of OLED devices with/without photolithographic patterning.

Refer to FIG. 3 for the experiment results showing the relation between voltage and current density of OLED devices with/without photolithographic patterning in accordance with the present invention, and FIG. 4 for the experiment results showing the relation between voltage and brightness of OLED devices with/without photolithographic patterning in accordance with the present invention.

In FIGS. 3 and 4, OLED devices with photolithographic patterning (having an aluminum oxide protecting layer thin film) are compared with OLED devices without photolithographic patterning (having no aluminum oxide protecting layer thin film), wherein the structures and materials of both OLED devices are the same, but the properties of the OLED devices having or not having an aluminum oxide protecting layer thin film are compared. The figures show that the photolithographic patterning process does not adversely affect the properties of the devices. On the other hand, the performance of the devices with the photolithographic pattern is enhanced, since the thickness of the aluminum oxide protecting layer is adequately thin for it to serve as an injection-enhancing buffer, lowering the turn-on voltage and increasing current density, brightness, and efficiency. The protecting layer can also isolate air and environmental changes from the device to avoid their adverse effects.

The present invention is characterized in that an ultra thin protecting layer (such as an inorganic oxide layer) that is not affected by the environment of the manufacturing process is formed on the sensitive materials of the desired pattern to isolate the solvent and etching solution (or gas) and material from a direct contact with the sensitive materials during the photolithographic process, so as to avoid damages to the materials. The thickness of the protecting layer is very thin, which may be as small as several angstroms. After the pattern is completed the protecting layer does not need to be removed from the surface, but remains as a part of the product. Due to the ultra thin thickness of the protecting layer, the performance of the product are not affected, but improved instead.

In summary, the features and effects of the present invention reside on that:

1. The present invention enables photolithography to be used for patterning a device containing sensitive optoelectronic materials such as an organic light emitting diode (OLED) display to overcome the inability of the present patterning technology (including the photomask deposition method and the ink-jet printing method) to be used in commercialization and mass production.

2. The ultra thin protecting layer used in the present invention not only effectively isolates the sensitive optoelectronic materials from the solvents and etching reactants during a photolithographic process, but it remains as an integral part of the device. Since the protecting layer is ultra thin, it has no adverse effect on the performance of the device but may even enhance the performance. The protecting layer can also isolate the sensitive materials from air and environmental changes.

3. When the present invention is applied to an organic light emitting diode (OLED) display the ultra thin protecting layer effectively isolates the organic solvent and etching reactant from a direct contact with the organic electroluminescent material during the photolithographic process. When the protecting layer becomes a portion of the device (wherein the protecting layer is situated between the electrode and the organic electroluminescent material), the number of injected electrons increases so that the numbers of electrons and electron-holes can be balanced, and the efficiency and brightness are enhanced greatly. The efficiency and brightness are enhanced when the protecting layer concurrently has the function of a buffer layer. The buffer layer between the electrode and the organic electroluminescent material is a thin film insulator with a very thin thickness (from several tens to hundreds of angstroms), and its mechanism has been disclosed in many technical literatures and journals.

While the invention has been described in terms of what is presently considered to be the most practical and preferred embodiments it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming electronic devices by using protecting layers, comprising the steps of:
   providing a substrate, for coating a first electroluminescent material onto a surface of the substrate to form a first light-emitting layer, and forming a first protecting layer onto the first light-emitting layer;
   performing a first patterning process, for forming a first photoresist layer on the first protecting layer and forming a first photomask to define a required pattern on the first photoresist layer, exposing to remove a portion of the first photoresist layer, and keeping a remaining first photoresist layer;
   removing a portion of the first protecting layer that is not sheltered by the first photoresist layer to etch the first light-emitting layer;
   removing the remaining first photoresist layer, such that the first light-emitting layer remains protected by the first protecting layer;
   coating a second electroluminescent material onto a surface of the substrate, the first light-emitting layer and the first protecting layer to form a second light-emitting layer, and forming a second protecting layer on the second light-emitting layer;

performing a second patterning process, for forming a second photoresist layer on the second protecting layer, using an appropriate mask and an exposure process to define a pattern required by the second photoresist layer, exposing to remove a portion of the second photoresist layer, and keeping a remaining second photoresist layer;

removing a portion of the second protecting layer that is not sheltered by the second photoresist layer to etch the second light-emitting layer;

removing the remaining second photoresist layer, such that the second light-emitting layer remains protected by the second protecting layer;

coating a third electroluminescent material onto a surface of the substrate, the first light-emitting layer, the first protecting layer, the second light-emitting layer and the second protecting layer to form a third light-emitting layer, and forming a third protecting layer on the third light-emitting layer;

performing a third patterning process, for forming a third photoresist layer on the third protecting layer, using an appropriate mask and an exposure process to define a pattern required by the third photoresist layer, exposing to remove a portion of the third photoresist layer, and keeping a remaining third photoresist layer;

removing a portion of the third protecting layer that is not sheltered by the third photoresist layer to each the third light-emitting layer;

removing the remaining third photoresist layer, such that the third light-emitting layer remains protected by the third protecting layer; and forming a cathode layer on the first protecting layer, the second protecting layer, and the third protecting layer to form an optoelectronic device having the protecting layer.

2. A method for forming electronic devices by using protecting layers, comprising the steps:

providing a substrate;

coating a first electroluminescent material onto a surface of the substrate to form a first light-emitting layer;

forming a first protecting layer on the first light-emitting layer;

performing a first patterning process, for forming a first photoresist layer on the first protecting layer, forming a first photomask to define a required pattern on the first photoresist layer, exposing to remove a portion of the first photoresist layer, and keeping a remaining first photoresist layer;

removing a portion of the first protecting layer that is not sheltered by the first photoresist layer;

etching the first light-emitting layer;

removing the remaining first photoresist layer, such that the first light-emitting layer remains protected by the first protecting layer;

coating a second electroluminescent material onto a surface of the substrate, the first light-emitting layer and the first protecting layer to form a second light-emitting layer;

forming a second protecting layer onto the second light-emitting layer;

performing a second patterning process, for forming a second photoresist layer on the second protecting layer, using an appropriate mask and an exposure process to define a pattern required by the second photoresist layer, exposing to remove a portion of the second photoresist layer, and keeping a remaining second photoresist layer;

removing a portion of the second protecting layer that is not sheltered by the second photoresist layer;

etching the second light-emitting layer;

removing the remaining second photoresist layer, such that the second light-emitting layer remains protected by the second protecting layer;

coating a third electroluminescent material onto a surface of the substrate, the first light-emitting layer, the first protecting layer, the second light-emitting layer and the second protecting layer to form a third light-emitting layer;

forming a third protecting layer onto the third light-emitting layer;

performing a third patterning process, for forming a third photoresist layer on the third protecting layer, using an appropriate mask and an exposure process to define a pattern required by the third photoresist layer, exposing to remove a portion of the third photoresist layer, and keeping a remaining third photoresist layer;

removing a portion of the third protecting layer that is not sheltered by the third photoresist layer;

etching the third light-emitting layer;

removing the remaining third photoresist layer, such that the third light-emitting layer remains protected by the third protecting layer; and forming a cathode layer on the first protecting layer, the second protecting layer, and the third protecting layer so as to form an optoelectronic device with the protecting layers.

3. The method as recited of claim 2, wherein the first light-emitting layer, the second light-emitting layer and the third light-emitting layer are made of different electroluminescent materials.

4. The method as recited of claim 3, wherein the electroluminescent materials contain small organic molecules or polymers.

5. The method as recited of claim 2, wherein the protecting layers comprise a material that is not affected by an organic solvent and an etching reactant.

6. The method as recited of claim 2, wherein the cathode layer is made of an electrically conductive material.

7. The method as recited in claims 1 or 2, wherein the patterning processes comprise a photolithographic process.

* * * * *

UNITED STATES PATENT AND TRADEMARK OFFICE
CERTIFICATE OF CORRECTION

| | | |
|---|---|---|
| PATENT NO. | : 7,947,518 B2 | Page 1 of 1 |
| APPLICATION NO. | : 11/830365 | |
| DATED | : May 24, 2011 | |
| INVENTOR(S) | : Tsai et al. | |

It is certified that error appears in the above-identified patent and that said Letters Patent is hereby corrected as shown below:

IN THE PATENT:

Column 6, line 8:

Now reads: "second light-emitting, layer"

Should read: -- second light-emitting layer --

Column 6, line 29:

Now reads: "protecting layer 1(09 to form"

Should read: -- protecting layer 109 to form --

Column 6, line 40:

Now reads: "by the developing solution"

Should read: -- by the developing solution. --

Column 7, line 22:

Now reads: "second light-emitting, layer"

Should read: -- second light-emitting layer --

Signed and Sealed this
Sixteenth Day of October, 2012

David J. Kappos
*Director of the United States Patent and Trademark Office*